(12) United States Patent
Mulfinger et al.

(10) Patent No.: US 10,008,576 B2
(45) Date of Patent: Jun. 26, 2018

(54) EPI FACET HEIGHT UNIFORMITY IMPROVEMENT FOR FDSOI TECHNOLOGIES

(71) Applicant: GLOBALFOUNDRIES Inc., Grand Cayman (KY)

(72) Inventors: George Robert Mulfinger, Wilton, NY (US); Xusheng Wu, Ballston Lake, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days. days.

(21) Appl. No.: 15/490,180

(22) Filed: Apr. 18, 2017

(65) Prior Publication Data

US 2017/0222015 A1    Aug. 3, 2017

Related U.S. Application Data

(62) Division of application No. 14/963,397, filed on Dec. 9, 2015, now Pat. No. 9,704,971.

(51) Int. Cl.
*H01L 29/49* (2006.01)
*H01L 29/786* (2006.01)
(Continued)

(52) U.S. Cl.
CPC ...... *H01L 29/4983* (2013.01); *H01L 29/0649* (2013.01); *H01L 29/0847* (2013.01);
(Continued)

(58) Field of Classification Search
CPC .......... H01L 29/4983; H01L 29/78654; H01L 29/66772; H01L 29/66628; H01L 29/7838;
(Continued)

(56) References Cited

U.S. PATENT DOCUMENTS

| | | | |
|---|---|---|---|
| 2003/0059535 A1* | 3/2003 | Luo | C23C 16/45523 427/255.28 |
| 2011/0156107 A1* | 6/2011 | Bohr | H01L 21/76831 257/288 |
| 2011/0254090 A1* | 10/2011 | Cheng | H01L 29/66772 257/347 |
| 2011/0291168 A1* | 12/2011 | Iwasa | H01L 27/10873 257/296 |
| 2013/0015525 A1* | 1/2013 | Cheng | H01L 21/823814 257/351 |
| 2014/0021517 A1 | 1/2014 | Cheng et al. | |

FOREIGN PATENT DOCUMENTS

TW    201428889 A    7/2014

OTHER PUBLICATIONS

Senzaki et al., "Single-wafer Furnace RTCVD for Silicon Oxide, Nitride, and Oxynitride Thin Films", 9th International Conference on Advanced Thermal Processing of Semiconductors—RTP' 2001, Sep. 25-29, 2001, pp. 197-200, 4 Pages.

(Continued)

*Primary Examiner* — Steven Loke
*Assistant Examiner* — Juanita Rhodes
(74) *Attorney, Agent, or Firm* — Ditthavong & Steiner, P.C.

(57) ABSTRACT

A method of controlling the facet height of raised source/drain epi structures using multiple spacers, and the resulting device are provided. Embodiments include providing a gate structure on a SOI layer; forming a first pair of spacers on the SOI layer adjacent to and on opposite sides of the gate structure; forming a second pair of spacers on an upper surface of the first pair of spacers adjacent to and on the opposite sides of the gate structure; and forming a pair of faceted raised source/drain structures on the SOI, each of the faceted source/drain structures faceted at the upper surface of the first pair of spacers, wherein the second pair of spacers is more selective to epitaxial growth than the first pair of spacers.

9 Claims, 4 Drawing Sheets

(51) Int. Cl.
  *H01L 29/66* (2006.01)
  *H01L 29/78* (2006.01)
  *H01L 29/08* (2006.01)
  *H01L 29/06* (2006.01)

(52) U.S. Cl.
  CPC .... *H01L 29/6656* (2013.01); *H01L 29/66575* (2013.01); *H01L 29/66628* (2013.01); *H01L 29/66772* (2013.01); *H01L 29/786* (2013.01); *H01L 29/7838* (2013.01); *H01L 29/78654* (2013.01)

(58) Field of Classification Search
  CPC ............ H01L 29/6656; H01L 29/0847; H01L 29/0649; H01L 29/786; H01L 29/66575
  See application file for complete search history.

(56) References Cited

OTHER PUBLICATIONS

Taiwanese Office Action for related Taiwanese Patent Application No. 105133687 dated Oct. 27, 2017, 11 Pages.
Taiwanese Office Action for related Taiwanese Patent Application No. 105133687 dated Mar. 19, 2018, 13 Pages.

* cited by examiner

EPI FACET HEIGHT UNIFORMITY IMPROVEMENT FOR FDSOI TECHNOLOGIES

RELATED APPLICATION

The present application is a Divisional of Application Ser. No. 14/963,397, filed on Dec. 9, 2015, which is incorporated herein by reference in its entirety.

TECHNICAL FIELD

The present disclosure relates to the manufacture of semiconductor devices with the front-end-of-line (FEOL) process flow. The disclosure is particularly applicable to fully depleted silicon-on-insulator (FDSOI) technologies.

BACKGROUND

FDSOI technology relies on overfilled epitaxial (epi) layers to supply dopants to the source/drain which results in extremely high parasitic capacitance (between the gate and the raised source/drain). Faceted epi is preferred for FDSOI technology to reduce this parasitic capacitance (Ceff), but it is hard to control. Faceted epi can also suffer from poor wafer-to-wafer and lot-to-lot variability. For instance, facet height, Ceff, available dopant to diffuse to the channel, and silicide proximity are all variable.

A need therefore exists for methodology enabling control of faceted raised source/drain epi formation, and the resulting device.

SUMMARY

An aspect of the present disclosure is a process of controlling the facet height of raised source/drain epi structures using multiple spacers.

Another aspect of the present disclosure is a device including controlled facets of raised source/drain epi structures.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: providing a gate structure on a silicon-on-insulator (SOI) layer; forming a first pair of spacers on the SOI layer adjacent to and on opposite sides of the gate structure; forming a second pair of spacers on an upper surface of the first pair of spacers adjacent to and on the opposite sides of the gate structure; and forming a pair of faceted raised source/drain structures on the SOI, each of the faceted source/drain structures faceted at the upper surface of the first pair of spacers, wherein the second pair of spacers is more selective to epitaxial growth than the first pair of spacers.

Aspects of the present disclosure include forming the first pair of spacers to a greater width than the second pair of spacers. Other aspects include controlling facets of the raised source/drain structures by a difference between a width of one of the first set of spacers and a width of one of the second pair of spacers. Further aspects include controlling facets of the raised source/drain structures by a difference between a material of the first set of spacers and a material of the second pair of spacers. Another aspect includes forming the first pair of spacers of furnace nitride by molecular layer deposition (MLD). Additional aspects include forming the first pair of spacers of deposited nitride by plasma enhanced chemical vapor deposition (PECVD). Other aspects include forming each of the first pair of spacers with a sidewall angle between 45° and 90°, the sidewall angle facing away from the gate structure. Another aspect includes forming the second pair of spacers of furnace nitride by MLD. Additional aspects include forming the second pair of spacers of a low-K film. Other aspects include forming the faceted raised source/drain structures by epitaxial growth.

Another aspect of the present disclosure is a device including: a gate structure formed on a SOI layer; a first pair of spacers formed on the SOI layer and on opposite sides of the gate structure; a second pair of spacers formed adjacent to and on the opposite sides of the gate structure, the second pair of spacers being more selective to epitaxial growth than the first pair of spacers; and a pair of faceted raised source/drain structures formed on the SOI, each of the source/drain structures faceted at the upper surface of the first pair of spacers.

Aspects of the device include each of the first pair of spacers having a greater width than each of the second pair of spacers. Other aspects include each of the first pair of spacers having a width of 5 nanometer (nm) to 10 nm and a height of 5 nm to 15 nm. Further aspects include each of the second pair of spacers having a width of 3 nm to 4 nm. Additional aspects include the second pair of spacers being formed either on the SOI layer or on an upper surface of the first pair of spacers. Another aspect includes the first pair of spacers being formed of furnace nitride by MLD or of deposited nitride by PECVD. Additional aspects include each of the first pair of spacers has a sidewall angle between 45° and 90°, and the sidewall angle faces away from the gate structure. Other aspects include the second pair of spacers being formed of furnace nitride by MLD or of a low-K film.

A further aspect of the present disclosure is a method including: providing a gate structure on a SOI layer; forming a first pair of spacers of a furnace nitride by MLD or of a low-K film, on the SOI layer adjacent to and opposite sides of the gate structure, each to a width of 3 nm to 4 nm; forming a second pair of spacers of furnace nitride by MLD or of deposited nitride by PECVD, on the SOI layer, each adjacent to one of the first pair of spacers, to a width of 5 nm to 10 nm, and having a sidewall angle between 45° and 90°; and epitaxially growing a pair of faceted raised source/drain structures on the SOI layer, each of the source/drain structures faceted at an upper surface of the second pair of spacers, wherein the first pair of spacers is more selective to epitaxial growth than the second pair of spacers. Aspects of the present disclosure include controlling facets of the raised source/drain structures by a difference between a width of one of the first pair of spacers and a width of one of the second pair of spacers and/or by a difference between a material of the first set of spacers and a material of the second pair of spacers.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accom- FIGS. 1 through 3 schematically illustrate a process flow for controlling the facet height of raised source/drain epi structures with multiple spacers, in accordance with an exemplary embodiment.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problems of difficulty controlling parasite capacitance and wafer-to-wafer and lot-to-lot variability attendant upon forming faceted raised source/drain epi structures for FDSOI technologies.

Methodology in accordance with embodiments of the present disclosure includes providing a gate structure on a SOI layer. A first pair of spacers is formed on the SOI layer adjacent to and on opposite sides of the gate structure. A second pair of spacers is then formed on an upper surface of the first pair of spacers adjacent to and on the opposite sides of the gate structure. Thereafter, a pair of faceted raised source/drain structures is formed on the SOI, each of the faceted source/drain structures faceted at the upper surface of the first pair of spacers, wherein the second pair of spacers is more selective to epitaxial growth than the first pair of spacers.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
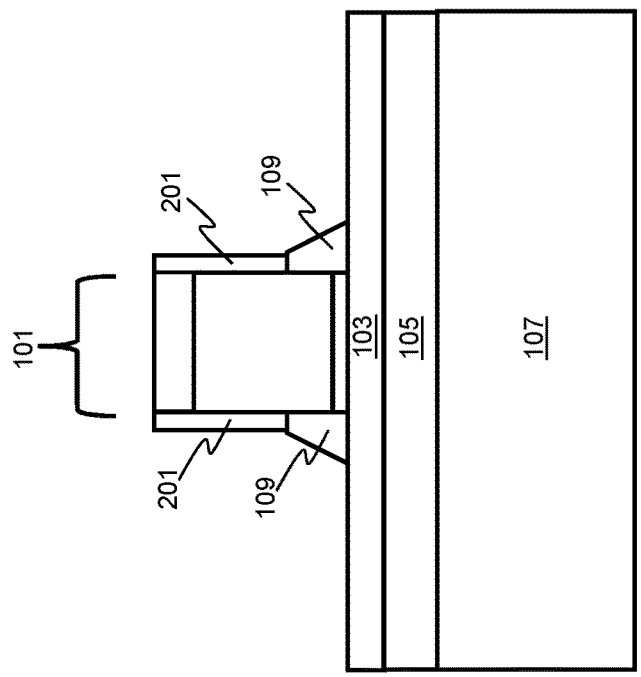
Figure 2:
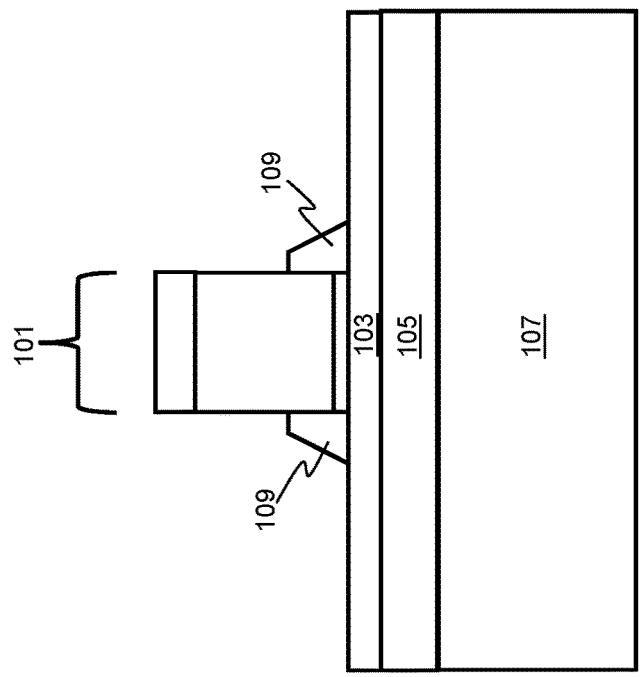
Figure 3:
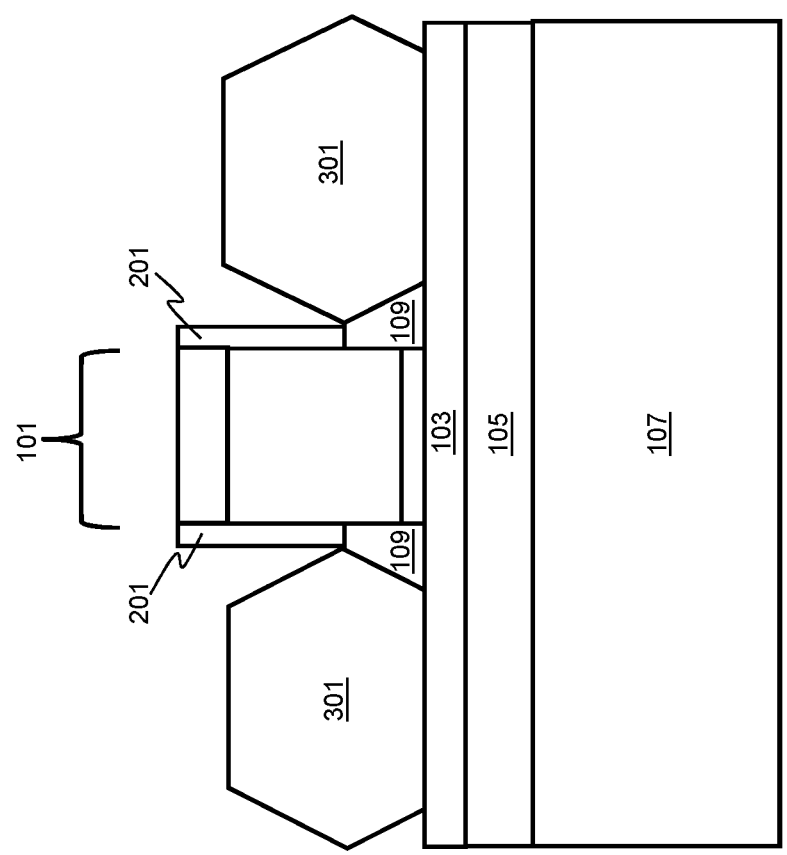

FIGS. 1 through 3 (cross-section views) schematically illustrate a process flow for controlling the facet height of raised source/drain epi structures with multiple spacers, in accordance with an exemplary embodiment. Adverting to FIG. 1, a gate structure 101 is formed on a SOI layer 103. The SOI layer 103 is formed over a buried oxide (BOX) layer 105, which is formed over a substrate 107. Spacers 109 are subsequently formed on the SOI layer 103 adjacent to and on opposite sides of the gate structure 101 by over-etching. For instance, a thin etch stop layer (not shown for illustrative convenience), e.g., either an oxidized surface or a deposited film, may be formed over the gate structure 101 and the SOI layer 103. Thereafter, a highly selective, polymerizing etch chemistry, e.g., fluoromethane ($CH_3F$)/methane ($CH_4$)/oxygen ($O_2$)($CH_3F/CH_4/O_2$), may be used to stop on the etch stop layer. In addition, bias power should be high to ensure anisotropy.

The spacers 109 may be formed, for example, of furnace nitride by MLD for improved isolation/density loading and step coverage. The spacers 109 may alternatively be formed, for example, of deposited nitride by PECVD. In addition, other dielectrics may be used assuming good selectivity to the underlying SOI layer 103; however, oxygen should be avoided for gate first integration.

The spacers 109 may be formed, for example, to a width of 5 nm to 10 nm, as thinner widths enhance device performance. The spacers 109 may be formed, for example, to a height of 5 nm to 15 nm. The height of the spacers 109 should be as short as possible while still forcing the subsequently formed raised source/drain structures to facet to minimize the parasitic capacitance between the gate 101 and the raised source/drain structures. Further, the spacers 109 may be formed, for example, with a sidewall angle between 45° and 90°. A steeper sidewall minimizes the width of the spacers 109.

Adverting to FIG. 2, a pair of spacers 201 is formed on the upper surfaces of the spacers 109 adjacent to and on opposite sides of the gate structure 101. The spacers 201 are formed of a material that is more selective to epi growth compared to the spacers 109. The spacers 201 may be formed, for example, of furnace nitride by MLD or of a low-k film. For instance, the spacers 201 may be formed, e.g., of MLD nitride, MLD low-k SiOCN, or MLD low-k SiBCN. Any material could be used if the spacers 109 extend beyond the spacers 201. The spacers 201 may be formed, for example, by an etching process that is anisotropic and selective to the source/drain material and the SOI layer 101. This may be achieved with a main etch plus an over-etch process. For instance, the main etch chemistry may include fluoroform ($CHF_3$) or tetrafluoromethane ($CF_4$), and the over-etch chemistry may be polymerizing and selective, e.g., $CH_3F/O_2$ or $CH_3F/CH_4/O_2$. In addition, the spacers 201 may be formed, for example, to a width of 3 nm to 4 nm. The spacers 201 need to be thick enough to prevent the subsequently formed raised source/drain structures from growing on the gate structure 101. Ideally, the spacers 201 will be formed to at least 1 nm to 2 nm thinner than the spacers 109. If the spacers 109 stick out further than spacers 201, it will further ensure the subsequent epi facet.

Next, a pair of faceted raised source/drain structures 301 are formed on the SOI layer 101 with each of the faceted source/drain structures 301 faceted at the upper surface of the spacers 109, as depicted in FIG. 3. The source/drain structures 301 are formed by epitaxial growth and the facet is forced where the epi meets the spacers 201, i.e., at the upper surface of the spacers 109. The facets of the source/drain structures 301 may be controlled, for example, by the difference in the width between the spacers 109 and the spacers 201, e.g., a minimum of 1 nm to 2 nm. The facets of the source/drain structures 301 may alternatively or additionally be controlled, for example, by the material difference between the spacers 109 and the spacers 201. Further, the facets of the source/drain structures 301 may be controlled, e.g., by the shape (foot amount) of the spacers 109.

Figure 4:
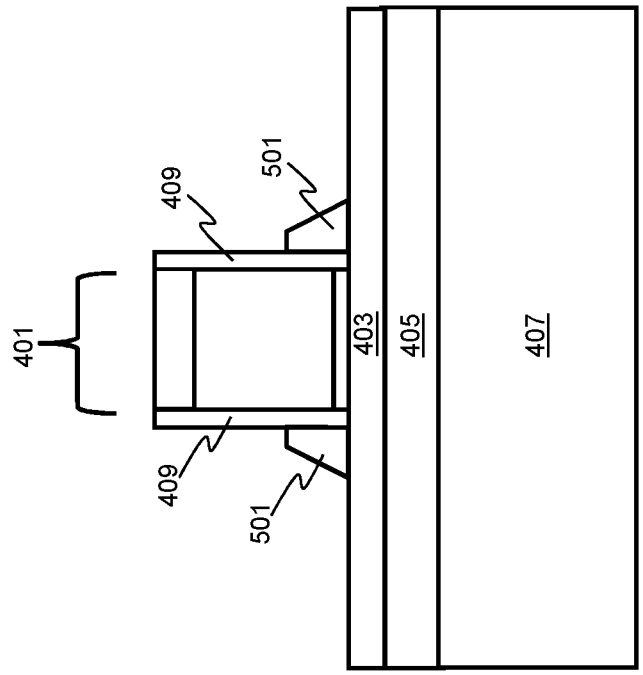
FIGS. 4 through 6 schematically illustrate a process flow for controlling the facet height of raised source/drain epi structures with multiple spacers, in accordance with another exemplary embodiment.
Figure 5:
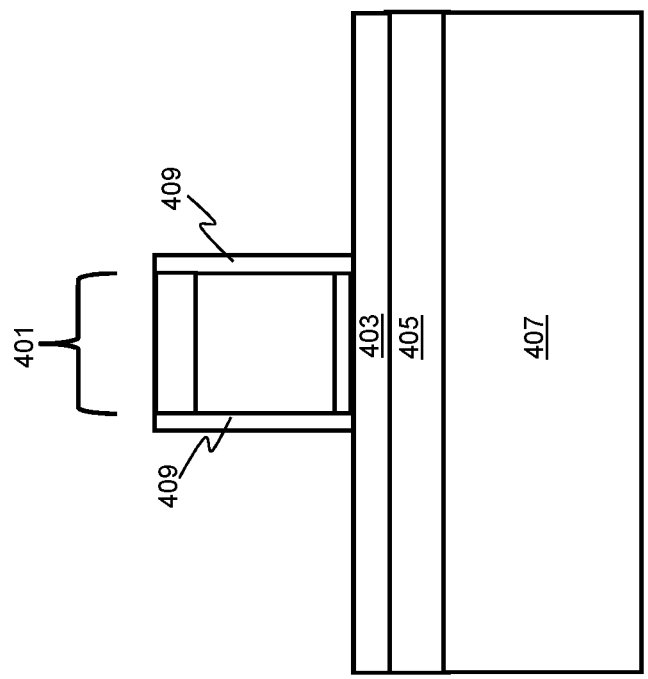
Figure 6:
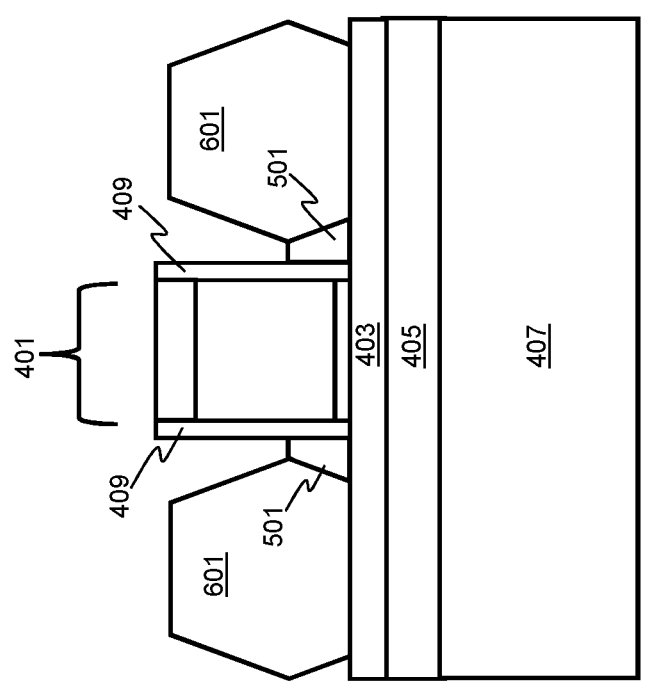

FIGS. 4 through 6 (cross-section views) schematically illustrate a process flow for controlling the facet height of raised source/drain epi structures with multiple spacers, in accordance with another exemplary embodiment. Adverting to FIG. 4, a gate structure 401 is formed on a SOI layer 403. The SOI layer 403 is formed over a BOX layer 405, which is formed over a substrate 407. Spacers 409 are subsequently formed on the SOI layer 403 adjacent to and on opposite sides of the gate structure 401 by a standard etching process. The spacers 409 may be formed, for example, of furnace nitride by MLD or of a low-k film. For instance, the spacers 409 may be formed, e.g., of MLD nitride, MLD low-k SiOCN, or MLD low-k SiBCN. An oxygen-based thin etch stop layer (not shown for illustrative convenience), e.g., silicon dioxide ($SiO_2$), is then formed over the gate structure 401, the SOI layer 403, and the spacers 401. The oxygen-based thin etch stop layer can protect the gate structure 401 from oxygen ingress (specific to gate-first integration).

Adverting to FIG. 5, spacers 501 are formed on the SOI layer 403 adjacent to the spacers 409, e.g., by over-etching. The spacers 501 are formed of a material that is less selective to epi growth compared to the spacers 409. The spacers 501 may be formed, for example, of furnace nitride by MLD for improved isolation/density loading and step coverage. The spacers 501 may alternatively be formed, for example, of deposited nitride by PECVD. In addition, other dielectrics may be used assuming good selectivity to the underlying SOI layer 403; however, oxygen should be avoided for gate-first integration.

Similar to the spacers 109, the spacers 501 may be formed, for example, to a width of 5 nm to 10 nm, as thinner widths enhance device performance. The spacers 501 may be formed, for example, to a height of 5 nm to 15 nm. The height of the spacers 501 should be as short as possible while still forcing the subsequently formed raised source/drain structures to facet to minimize the parasitic capacitance between the gate 401 and the raised source/drain structures. Further, the spacers 501 may be formed, for example, with a sidewall angle between 45° and 90°. Again, a steeper sidewall minimizes the width of the spacers 401.

Next, a pair of faceted raised source/drain structures 601 are formed on the SOI layer 403 with each of the faceted source/drain structures 601 faceted at the upper surface of the spacers 501, as depicted in FIG. 6. The source/drain structures 601, like the source/drain structures 301, are formed by epitaxial growth and the facet is forced where the epi meets the upper surface of the spacers 501. Again, the facets of the source/drain structures 601 may be controlled, for example, by the difference in the width between the spacers 409 and the spacers 501, e.g., a minimum of 1 nm to 2 nm. The facets of the source/drain structures 601 may alternatively or additionally be controlled, for example, by the material difference between the spacers 409 and the spacers 501. Further, the facets of the source/drain structures 601 may be controlled, e.g., by the shape (foot amount) of the spacers 501.

The embodiments of the present disclosure can achieve several technical effects including controlling the facet height of the raised source/drain epi structures and, therefore, enabling performance enhancement by eliminating the variability of the Ceff, the overlap capacitance (Cov), and the silicide proximity. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure therefore has industrial applicability with respect to FDSOI technologies.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A device comprising:
a gate structure on a silicon-on-insulator (SOI) layer;
a first pair of spacers on the SOI layer adjacent to and on opposite sides of the gate structure, wherein the first pair of spacers have uppermost and lowermost surfaces parallel to the SOI layer and side surfaces of the first pair of spacers being inclined from the uppermost surfaces of the first pair of spacers, such that each of the inclined side surfaces of the first pair of spacers forms an acute angle with the SOI layer and each of the inclined side surfaces of the first pair of spacers forms an obtuse angle with the uppermost surfaces of the first pair of spacers;
a second pair of spacers on the uppermost surfaces of the first pair of spacers, but not on the inclined side surfaces of the first pair of spacers, adjacent to and on the opposite sides of the gate structure, wherein upper surfaces and lower surfaces of the second pair of spacers are parallel to the uppermost surfaces of the first pair of spacers and the lower surfaces of the second pair of spacers contact the uppermost surfaces of the first pair of spacers; and
a pair of faceted raised source/drain structures on the SOI layer, wherein each of the faceted raised source/drain structures has a corner formed by two facets contacting an interface of the upper surface of a corresponding one of the first pair of spacers and the lower surface of a corresponding one of the second pair of spacers, and wherein portions of the pair of faceted raised source/drain structures contact the inclined side surfaces of the first pair of spacers, wherein the second pair of spacers is more selective to epitaxial growth than the first pair of spacers.

2. The device according to claim 1, wherein each of the lower surfaces of the first pair of spacers have a width greater than a width of each of the lower surfaces of the second pair of spacers.

3. The device according to claim 2, wherein each of the facets of the pair of faceted raised source/drain structures is determined by a difference between a width of the lower surface of one of the first pairs of spacers and a width of the lower surface of one of the second pairs of spacers.

4. The device according to claim 1, wherein the first pair of spacers comprise a furnace nitride.

5. The device according to claim 1, wherein the first pair of spacers comprise a nitride.

6. The device according to claim 1, wherein each of the first pair of spacers are at an acute angle between 45° and 90°, and the acute angle faces away from the gate structure.

7. The device according to claim 1, wherein the second pair of spacers comprise a furnace nitride.

8. The device according to claim 1, wherein the second pair of spacers comprise a low-K film.

9. The device according to claim 1, wherein the pair of faceted raised source/drain structures are epitaxially grown.

* * * * *